(12) United States Patent
Radke

(10) Patent No.: US 8,531,877 B2
(45) Date of Patent: *Sep. 10, 2013

(54) FRACTIONAL BITS IN MEMORY CELLS

(75) Inventor: William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/403,078

(22) Filed: Feb. 23, 2012

(65) Prior Publication Data

US 2012/0147672 A1 Jun. 14, 2012

Related U.S. Application Data

(63) Continuation of application No. 12/949,347, filed on Nov. 18, 2010, now Pat. No. 8,125,826, which is a continuation of application No. 11/932,287, filed on Oct. 31, 2007, now Pat. No. 7,848,142.

(51) Int. Cl.
*G11C 16/04* (2006.01)

(52) U.S. Cl.
USPC ............. 365/185.03; 365/185.22; 365/185.28

(58) Field of Classification Search
USPC ............................ 365/185.03, 185.22, 185.28
See application file for complete search history.

(56) References Cited

U.S. PATENT DOCUMENTS

| | | | |
|---|---|---|---|
| 5,768,188 A | 6/1998 | Park et al. | |
| 5,872,735 A | 2/1999 | Banks | |
| 6,456,528 B1 | 9/2002 | Chen | |
| 6,587,372 B2 | 7/2003 | Blodgett | |
| 6,779,073 B2 | 8/2004 | McLaughlin et al. | |
| 6,807,095 B2 | 10/2004 | Chen et al. | |
| 6,807,610 B2 | 10/2004 | Frayer | |
| 6,816,407 B2 | 11/2004 | Rolandi | |
| 6,868,008 B2 | 3/2005 | Kamei et al. | |
| 6,963,507 B2 | 11/2005 | Tanaka et al. | |
| 7,016,226 B2 | 3/2006 | Shibata et al. | |
| 7,043,089 B2 | 5/2006 | Ballard | |
| 7,071,849 B2 | 7/2006 | Zhang | |
| 7,095,654 B2 | 8/2006 | Quader et al. | |
| 7,164,601 B2 | 1/2007 | Mitani et al. | |
| 7,167,109 B2 | 1/2007 | Hu et al. | |
| 7,352,628 B2 | 4/2008 | Kamei | |
| 7,457,155 B2 | 11/2008 | Nazarian | |
| 7,457,178 B2 | 11/2008 | Tu et al. | |

(Continued)

OTHER PUBLICATIONS

Cho, Myoung Kwan, "International Search Report" from related PCT Application, mailed Jan. 23, 2009 (3 pgs.).

(Continued)

*Primary Examiner* — Pho M Luu
(74) *Attorney, Agent, or Firm* — Brooks, Cameron & Huebsch, PLLC

(57) ABSTRACT

Methods, devices, modules, and systems for programming memory cells can include storing charges corresponding to a data state that represents an integer number of bits in a set of memory cells. Programming memory cells can include storing a charge in a cell of the set, where the charge corresponds to a programmed state, where the programmed state represents a fractional number of bits, and where the programmed state denotes a digit of the data state as expressed by a number in base N, where N is equal to $2^B$, rounded up to an integer, and where B is equal to the fractional number of bits represented by the programmed state.

20 Claims, 7 Drawing Sheets

(56) References Cited

U.S. PATENT DOCUMENTS

| | | | |
|---|---|---|---|
| 7,518,914 B2 | 4/2009 | Han | |
| 7,518,923 B2 | 4/2009 | Mokhlesi | |
| 7,613,883 B2 | 11/2009 | Bellows et al. | |
| 7,668,012 B2 | 2/2010 | Aritome | |
| 7,742,335 B2 | 6/2010 | Aritome | |
| 7,813,212 B2 | 10/2010 | Kim | |
| 7,848,142 B2 * | 12/2010 | Radke | 365/185.03 |
| 7,911,835 B2 | 3/2011 | Kim | |
| 7,936,610 B1 * | 5/2011 | Melcher et al. | 365/185.25 |
| 8,098,530 B2 * | 1/2012 | Sarin | 365/185.29 |
| 8,125,826 B2 * | 2/2012 | Radke | 365/185.03 |
| 8,144,516 B2 * | 3/2012 | Zhao et al. | 365/185.12 |
| 2004/0080979 A1 | 4/2004 | Park | |
| 2005/0213393 A1 | 9/2005 | Lasser | |
| 2005/0237814 A1 | 10/2005 | Li et al. | |
| 2006/0028877 A1 | 2/2006 | Meir | |
| 2006/0209596 A1 | 9/2006 | Li | |
| 2006/0215450 A1 | 9/2006 | Honma et al. | |
| 2006/0227021 A1 | 10/2006 | Hu et al. | |
| 2007/0159891 A1 | 7/2007 | Tu et al. | |
| 2009/0046510 A1 | 2/2009 | Song et al. | |
| 2010/0157641 A1 | 6/2010 | Shalvi et al. | |

OTHER PUBLICATIONS

Cho, Myoung Kwan, "International Search Report" from related PCT Application PCT/US2008/011836, mailed Feb. 18, 2009 (3 pages).

European Search Report for related EP Application 08845348.5, mailed Apr. 18, 2011 (8 pages).

Park, et al., "A Zeroing Cell-to-Cell Interference Page Architecture with Temporary LSB Storing Program Scheme for Sub-40nm MLC NAND Flash Memories and beyond," 2007 IEEE Symposium on VLSI Circuits, IEE Piscataway, NJ, USA, Jun. 1, 2007, pp. 188-189.

China Office Action for related China Application No. 200880114320.2, mailed Oct. 8, 2012, (6 pgs.).

Taiwanese Office Action for related Taiwanese Application No. 097142217, mailed Feb. 6, 2013, (5 pgs.).

\* cited by examiner

2 CELLS WITH 2 BITS PER CELL AND A RANGE OF 0V-1V

| | | | | | | | | | | | | | | | | | |
|---|---|---|---|---|---|---|---|---|---|---|---|---|---|---|---|---|---|
| 311 — DATA STATE | 0000 | 0001 | 0010 | 0011 | 0100 | 0101 | 0110 | 0111 | 1000 | 1001 | 1010 | 1011 | | | | | |
| 321 — DECIMAL | 0 | 1 | 2 | 3 | 4 | 5 | 6 | 7 | 8 | 9 | 10 | 11 | | | | | |
| 331 — BASE 4 | 0 | 1 | 2 | 3 | 10 | 11 | 12 | 13 | 20 | 21 | 22 | 23 | | | | | |
| 341 — PGM STATES | 0\|0 | 0\|1 | 0\|2 | 0\|3 | 1\|0 | 1\|1 | 1\|2 | 1\|3 | 2\|0 | 2\|1 | 2\|2 | 2\|3 | | | | | |
| 351 — VOLTAGES | 0\|0 | 0\|0.25 | 0\|0.50 | 0\|0.75 | 0.25\|0 | 0.25\|0.25 | 0.25\|0.50 | 0.25\|0.75 | 0.50\|0 | 0.50\|0.25 | 0.50\|0.50 | 0.50\|0.75 | | | | | |
| DATA STATE | 1100 | 1101 | 1110 | 1111 | | | | | | | | | | | | | |
| DECIMAL | 12 | 13 | 14 | 15 | | | | | | | | | | | | | |
| BASE 4 | 30 | 31 | 32 | 33 | | | | | | | | | | | | | |
| PGM STATES | 3\|0 | 3\|1 | 3\|2 | 3\|3 | | | | | | | | | | | | | |
| VOLTAGES | 0.75\|0 | 0.75\|0.25 | 0.75\|0.50 | 0.75\|0.75 | | | | | | | | | | | | | |

*Fig. 3A*

2 CELLS WITH 2.5 BITS PER CELL AND A RANGE OF 0V-1V

| | | | | | | | | | | | |
|---|---|---|---|---|---|---|---|---|---|---|---|
| DATA STATE | 00000 | 00001 | 00010 | 00011 | 00100 | 00101 | 00110 | 00111 | 01000 | 01001 | 01010 | 01011 |
| DECIMAL | 0 | 1 | 2 | 3 | 4 | 5 | 6 | 7 | 8 | 9 | 10 | 11 |
| BASE 6 | 0 | 1 | 2 | 3 | 4 | 5 | 10 | 11 | 12 | 13 | 14 | 15 |
| PGM STATES | 0\|0 | 0\|1 | 0\|2 | 0\|3 | 0\|4 | 0\|5 | 1\|0 | 1\|1 | 1\|2 | 1\|3 | 1\|4 | 1\|5 |
| VOLTAGES | 0\|0 | 0\|0.17 | 0\|0.34 | 0\|0.51 | 0\|0.68 | 0\|0.85 | 0.17\|0 | 0.17\|0.17 | 0.17\|0.34 | 0.17\|0.51 | 0.17\|0.68 | 0.17\|0.85 |

| | | | | | | | | | | | |
|---|---|---|---|---|---|---|---|---|---|---|---|
| DATA STATE | 01100 | 01101 | 01110 | 01111 | 10000 | 10001 | 10010 | 10011 | 10100 | 10101 | 10110 | 10111 |
| DECIMAL | 12 | 13 | 14 | 15 | 16 | 17 | 18 | 19 | 20 | 21 | 22 | 23 |
| BASE 6 | 20 | 21 | 22 | 23 | 24 | 25 | 30 | 31 | 32 | 33 | 34 | 35 |
| PGM STATES | 2\|0 | 2\|1 | 2\|2 | 2\|3 | 2\|4 | 2\|5 | 3\|0 | 3\|1 | 3\|2 | 3\|3 | 3\|4 | 3\|5 |
| VOLTAGES | 0.34\|0 | 0.34\|0.17 | 0.34\|0.34 | 0.34\|0.51 | 0.34\|0.68 | 0.34\|0.85 | 0.51\|0 | 0.51\|0.17 | 0.51\|0.34 | 0.51\|0.51 | 0.51\|0.68 | 0.51\|0.85 |

| | | | | | | | | | | | |
|---|---|---|---|---|---|---|---|---|---|---|---|
| DATA STATE | 11000 | 11001 | 11010 | 11011 | 11100 | 11101 | 11110 | 11111 | INVALID | INVALID | INVALID | INVALID |
| DECIMAL | 24 | 25 | 26 | 27 | 28 | 29 | 30 | 31 | 32 | 33 | 34 | 35 |
| BASE 6 | 40 | 41 | 42 | 43 | 44 | 45 | 50 | 51 | 52 | 53 | 54 | 55 |
| PGM STATES | 4\|0 | 4\|1 | 4\|2 | 4\|3 | 4\|4 | 4\|5 | 5\|0 | 5\|1 | 5\|2 | 5\|3 | 5\|4 | 5\|5 |
| VOLTAGES | 0.68\|0 | 0.68\|0.17 | 0.68\|0.34 | 0.68\|0.51 | 0.68\|0.68 | 0.68\|0.85 | 0.85\|0 | 0.85\|0.17 | 0.85\|0.34 | 0.85\|0.51 | 0.85\|0.68 | 0.85\|0.85 |

Fig. 3B

FRACTIONAL BITS IN MEMORY CELLS

CROSS-REFERENCE TO RELATED APPLICATIONS

This application is a Continuation of U.S. patent application Ser. No. 12/949,347, filed Nov. 18, 2010, which will issue as U.S. Pat. No. 8,125,826 and is a Continuation of U.S. patent application Ser. No. 11/932,287, filed Oct. 31, 2007, issued as U.S. Pat. No. 7,848,142 on Dec. 7, 2010, which are incorporated by reference herein.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Memory cells in an array architecture can be programmed to a desired state. That is, electric charge can be placed on or removed from the floating gate of a memory cell to put the cell into a number of stored states. For example, a single level cell (SLC) can represent two data states as represented by the binary digits 1 or 0. Flash memory cells can also store more than two data states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multidigit cells, or multilevel cells (MLCs). MLCs can allow the manufacture of higher density memories without increasing the number of memory cells since each cell can represent more than one digit, e.g., more than one bit.

MLCs can have more than one programmed state, e.g., a cell capable of representing two digits can have four programmed states, a cell capable of representing three digits can have eight program states, and a cell capable of representing four digits can have sixteen programmed states. Thus, MLCs can have $2^B$ programmed states, where B is equal to the number of binary digits that can be stored in the cell. Conventionally, the programmed states directly represent data states. For example, a cell that can store two binary digits can be programmed to one of four programmed states directly corresponding to one of four data states, such as 11, 01, 10, and 00.

BRIEF DESCRIPTION OF THE DRAWINGS

FIG. 3A illustrates a data conversion table for a set of two 2 bit memory cells in accordance with some previous approaches.

FIG. 3B illustrates a data conversion table for a set of two 2.5 bit memory cells in accordance with one or more embodiments of the present disclosure.

DETAILED DESCRIPTION

One method embodiment includes storing charges corresponding to a data state that represents an integer number of bits in a set of memory cells. The method also includes storing a charge in a cell of the set, where the charge corresponds to a programmed state, where the programmed state represents a fractional number of bits, and where the programmed state denotes a digit of the data state as expressed by a number in base N, where N is equal to $2^B$, rounded up to an integer, and where B is equal to the fractional number of bits represented by the programmed state.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
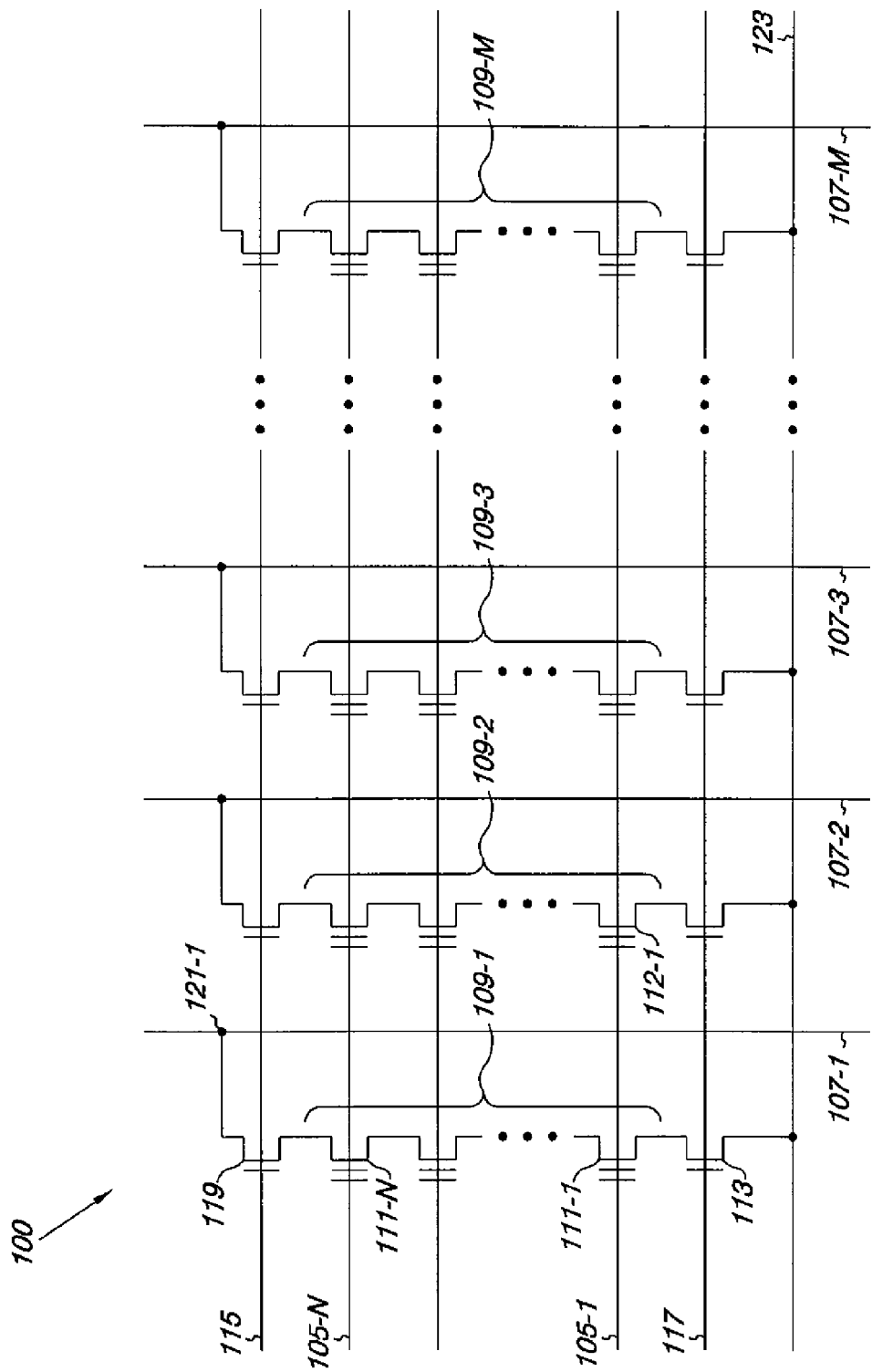
FIG. 1 is a schematic of a portion of a non-volatile memory array in accordance with one or more embodiments of the present disclosure.

FIG. 1 is a schematic of a portion of a non-volatile memory array 100. The embodiment of FIG. 1 illustrates a NAND architecture non-volatile memory. However, embodiments described herein are not limited to this example. As shown in FIG. 1, the memory array 100 includes select lines 105-1, . . . , 105-N and intersecting sense lines 107-1, . . . , 107-M. For ease of addressing in the digital environment, the number of select lines 105-1, . . . , 105-N and the number of sense lines 107-1, . . . , 107-M are each some power of two, e.g., 256 select lines by 4,096 sense lines.

Memory array 100 includes NAND strings 109-1, . . . , 109-M. Each NAND string includes non-volatile memory cells 111-1, . . . , 111-N, each located at an intersection of a select line 105-1, . . . , 105-N and a local sense line 107-1, . . . , 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SGD), e.g., FET 119. Source select gate 113 is located at the intersection of a local sense line 107-1 and a source select line 117 while drain select gate 119 is located at the intersection of a local sense line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In one or more embodiments, construction of non-volatile memory cells, 111-1, ..., 111-N, includes a source, a drain, a floating gate or other charge storage layer, and a control gate. Non-volatile memory cells, 111-1, ..., 111-N, have their control gates coupled to a select line, 105-1, ..., 105-N respectively. A column of the non-volatile memory cells, 111-1, ..., 111-N, make up the NAND strings, e.g., 109-1, ..., 109-M, coupled to a given local sense line, e.g., 107-1, ..., 107-M respectively. A row of the non-volatile memory cells are commonly coupled to a given select line, e.g., 105-1, ..., 105-N. A NOR array architecture would be similarly laid out except that the string of memory cells would be coupled in parallel between the select gates.

As one of ordinary skill in the art will appreciate, subsets of cells coupled to a selected select line, e.g., 105-1, ..., 105-N, can be programmed and/or sensed together as a group. A programming operation, e.g., a write operation, can include applying a number of program pulses, e.g., 16V-20V, to a selected select line in order to increase the threshold voltage (Vt) of selected cells to a desired program voltage level corresponding to a desired program state.

A sensing operation, such as a read or program verify operation, can include sensing a voltage and/or current change of a sense line coupled to a selected cell in order to determine the state of the selected cell. In one or more embodiments of the present disclosure, a sensing operation can be used for determining a charge stored in each cell of a set of memory cells, where the charge corresponds to a programmed state, and where the programmed state represents a fractional number of bits. The sensing operation can involve biasing a sense line, e.g., sense line 107-1, associated with a selected memory cell at a voltage above a bias voltage for a source line, e.g., source line 123, associated with the selected memory cell. A sensing operation could alternatively include precharging the sense line 107-1 followed with discharge when a selected cell begins to conduct, and sensing the discharge.

Sensing the state of a selected cell can include applying a sensing voltage to a selected select line, while biasing the unselected cells of the string at a voltage sufficient to place the unselected cells in a conducting state independent of the threshold voltage of the unselected cells. The sense line corresponding to the selected cell being read and/or verified can be sensed to determine whether or not the selected cell conducts in response to the particular sensing voltage applied to the selected select line. For example, the state of a selected cell can be determined by the select line voltage at which the sense line current reaches a particular reference current associated with a particular state. Reaching the particular reference current can be determined when the sense line current trips a sense amplifier for a particular charge, e.g., programmed state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the sense line corresponding to the string. For instance, data stored in the selected cell can be based on whether the sense line current changes by a particular amount or reaches a particular level in a given time period.

When the selected cell is in a conductive state, current flows between the source line contact at one end of the string and a sense line contact at the other end of the string. As such, the current associated with sensing the selected cell is carried through each of the other cells in the string, the diffused regions between cell stacks, and the select transistors.

In one or more embodiments of the present disclosure, a memory cell can be programmed to one of a number of threshold voltage levels corresponding to either an integer or fractional number of bits. A cell could store 3½ bits by being programmed to one of twelve programmed states. In order to output an integer number of bits, data from an even number of cells storing 3½ bits could be combined by a logic in control circuitry, e.g., a fractional bit controller. For example, in the embodiment illustrated in FIG. 1, data from cells 111-1 and 112-1, each storing a number of bits with a ½ fractional remainder, (e.g., 3½ bits), which are coupled to sense lines 107-1 and 107-2, could be combined by logic in control circuitry to output an integer number of bits.

Figure 2:
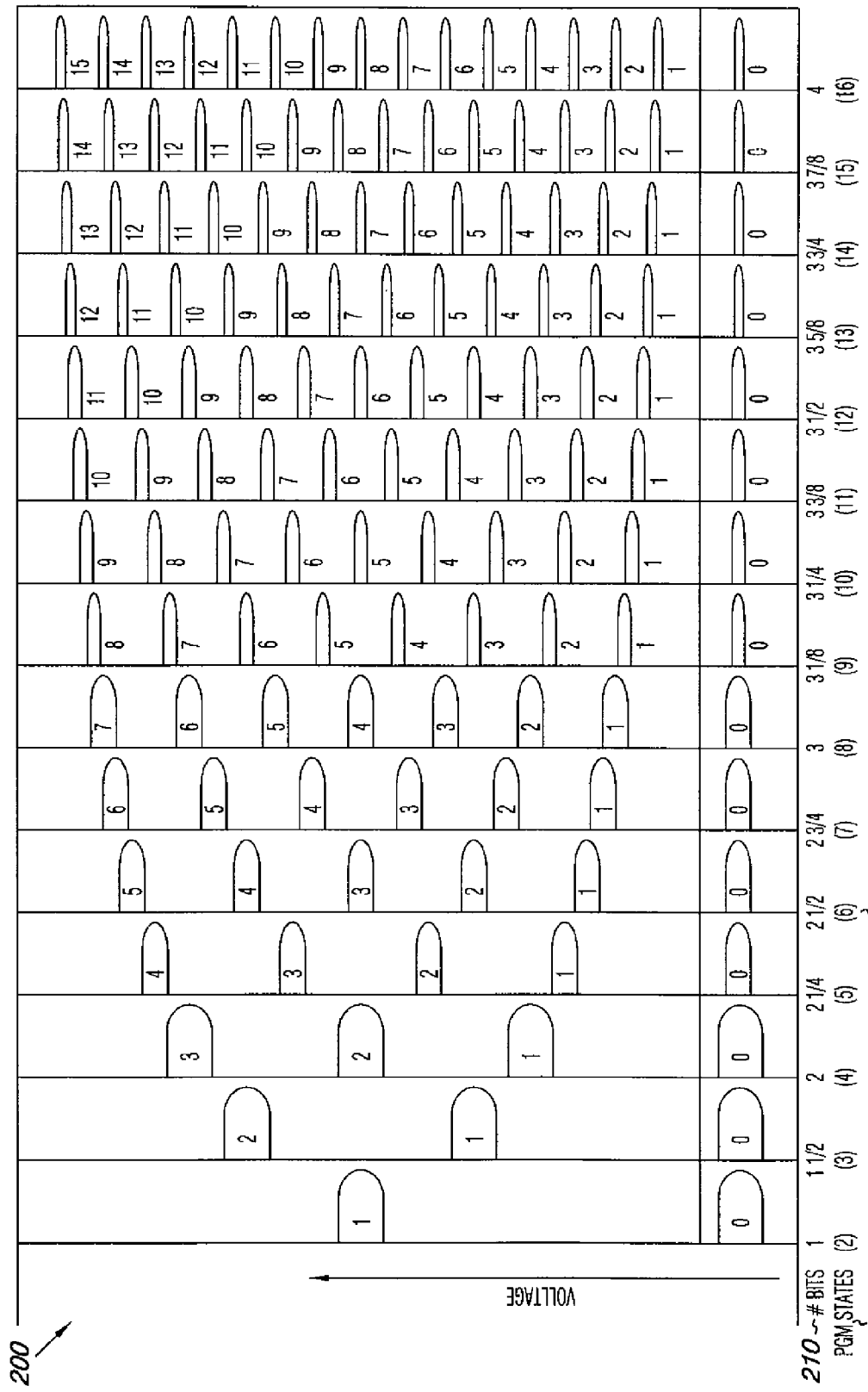
FIG. 2 illustrates a diagram of a number of threshold voltage levels for a memory device in accordance with one or more embodiments of the present disclosure.

FIG. 2 illustrates a diagram 200 of a number of threshold voltage levels for a memory device in accordance with one or more embodiments of the present disclosure. As indicated, the vertical axis represents an increasing voltage level. Embodiments of the present disclosure are not limited to a particular voltage range for a memory device. For example, some flash memory devices operate in a voltage range of –2V to +3V.

Row 210 indicates a number of bits that can be stored in a memory cell. Row 220 indicates a number of programmed states to which the memory cell may be programmed. A 1 bit cell can store one of two different programmed states as a charge, e.g., a threshold voltage level (Vt). A 1½ bit cell can store 3 programmed states; a 2 bit cell can store 4 programmed states, etc. As one of ordinary skill in the art will appreciate, for some memory devices, the lowermost programmed state storable on a particular memory cell can be referred to as an erased state because the cell can be in a lowermost state after an erase operation. One or more programming operations may be performed in order to charge the cell to a higher Vt level. Thus, in the illustration of FIG. 2, the lowermost programmed state for each column appears below a horizontal line, indicating that it could be an erased state. However, this illustration is merely an example and embodiments of the present disclosure are not limited to cells having a lowermost state as an erased state.

The illustration of FIG. 2 indicates that as a number of programmed states storable in a cell increases by an integer amount, e.g., 2, 3, 4, ..., 16, the number of corresponding bits increases by a fractional amount, e.g., 1, 1½, 2, 2¼, 2½, ..., 4. As an example, the column for a 1 bit cell includes two programmed states that could be represented in binary as a 0 and a 1. The column for a 2 bit cell includes four programmed states that could be represented in binary as 00, 01, 10, and 11. However, column 230 includes six programmed states for a 2½ bit cell, which do not correspond directly to binary. That is, there is no binary numerical representation of data stored in a single 2½ bit cell. However, binary data stored in a set of cells, individually storing a fractional number of bits, can be numerically represented. As is explained in more detail below with respect to FIG. 3B, cells storing a fractional number of bits can be read as a set in combination with, at least, a number of cells corresponding to the inverse of a fractional remainder of the number of bits stored. For example, two 2½ bit cells could be read together to produce a 5 bit output, and four 3¼ bit cells could be read together to produce a 13 bit output. A consideration of which programmed states, as represented by, e.g., threshold voltage levels, stored in a particular fractional bit cell, correspond to which binary values is discussed below in connection with FIG. 3B.

As is illustrated in FIG. 2, the threshold voltage distribution, i.e., the range of voltages within a particular Vt level, can decrease proportional to an increasing number of Vt levels stored in a particular memory cell with a given voltage range. For example, if a cell has a 0V-1V voltage range and can store 2 programmed states, a larger range of voltages can be available for each Vt level, e.g., 0.5V. However, if the same cell stores 10 programmed states, a smaller range of voltages can be available for each Vt level, e.g., 0.1V. Portions of a voltage range for a multilevel cell can be reserved for differentials between Vt levels to improve programming and/or sensing accuracy, among other reasons. As one of ordinary skill in the art will appreciate, the examples given here have a reduced level of detail to emphasize aspects of the present disclosure.

The programmed states, e.g., Vt levels, for a particular cell could be numbered. For example, the six programmed states for a 2½ bit cell could be numbered 0, 1, 2, 3, 4, and 5, as shown in column 230. Such numbered programmed states can denote digits of a data state as will be described in more detail below in connection with FIG. 3B. Furthermore, the charge, e.g., voltage level, corresponding to a particular programmed state can be referred to as a normalized value for the programmed state. A particular memory cell can store a charge within a given range of voltages. A memory device can normalize a programmed state by the number of programmed states storable in a particular memory cell from a voltage range for the particular cell.

FIG. 3A illustrates a data conversion table 301 for a set of two 2 bit memory cells in accordance with some previous approaches. Table 301 illustrates a data conversion table for a set of two 2 bit memory cells with a range of 0V-1V. Row 311 indicates data states in the form of binary values that can be represented by charge stored in the set of cells. In this case, row 311 indicates that these two memory cells can be used to represent 16 data states. As noted above in connection with FIG. 2, each 2 bit cell can store one of four programmed states. Row 321 indicates a decimal equivalent for the binary values in row 311. Row 331 indicates a base 4 equivalent for the decimal and binary values. Table 301 includes a base 4 equivalent because each cell is a 2 bit cell capable of storing one of four programmed states. As is described below in connection with FIG. 4B, data represented in a base corresponding to the number of programmed states that each cell of a set can store can be useful for storing a charge on one or more cells to represent data. Data represented in a base corresponding to the number of programmed states for a particular cell in the set can also be useful when sensing one or more cells to output data.

Row 341 indicates programmed states as represented by decimal numbers corresponding to the binary value (representing a data state) to be stored in the two cell set. As the reader will appreciate, the programmed states indicate a split of the base 4 number, in row 331, between the two cells of the set. The cell decimal numbers in row 341 can indicate a numbered programmed state, e.g., Vt level, to which each cell can be programmed, as is also described above in connection with FIG. 2.

Row 351 indicates voltages to which each cell of the set can be programmed to represent the binary value in row 311. As noted above, the memory cells of the set used as an example for table 301 each have a voltage range of 0V-1V. Each cell has four programmed states and the voltage increment per state is 0.025. Thus, programmed state 0 corresponds to 0V, programmed state 1 to 0.25V, programmed state 2 to 0.50V, and programmed state 3 to 0.75V. The voltage range and the distribution of those ranges listed are examples. One of ordinary skill in the art could use a different voltage range, or distribute the ranges differently. As the reader will appreciate, the charges, e.g. voltages, stored in each cell correspond directly to programmed states, which correspond directly to data states. That is, memory cells storing a charge corresponding to a programmed state representing an integer number of bits can be sensed individually to output meaningful data. In contrast, memory cells storing charges corresponding to programmed states representing a fractional number of bits, must be sensed in a set in order to output meaningful data, as will be described below with respect to FIG. 3B.

FIG. 3B illustrates a data conversion table 302 for a set of two 2.5 bit memory cells in accordance with one or more embodiments of the present disclosure. Table 302 illustrates a data conversion table for 2.5 bit memory cells with a range of 0V-1V. Row 312 indicates data states in the form of binary values that can correspond to charge stored in the set of cells. In this case, row 312 indicates that these two memory cells can be used to represent 32 data states with four extra combinations as described below. A set of two 2½ bit cells can store five bits. Row 322 indicates a decimal equivalent for the binary values in row 311. Row 332 indicates a base 6 equivalent for the decimal and binary values. Table 302 includes a base 6 equivalent because each cell is a 2½ bit cell capable of storing one of 6 programmed states.

Row 342 indicates numbered programmed states for each cell. As the reader will appreciate, the programmed states indicate a split of the base 6 number, in row 332, between the two cells of the set. The numbered programmed states in row 342 each denote a digit of the data state as expressed by the number in base 6 in row 332.

Row 352 indicates charges, e.g., voltages, to which each cell of the set can be programmed to correspond to the programmed state in row 342. As noted above, the memory cells of the set used as an example for table 302 have a voltage range of 0V-1V. Because each cell has six programmed states, the voltage increment per state is $\frac{1}{6}V \approx 0.17V$. Thus, programmed state 0 corresponds to 0V, programmed state 1 to 0.17V, programmed state 2 to 0.34V, programmed state 3 to 0.51V, programmed state 4 to 0.68V, and programmed state 5 to 0.85V. The voltage range and the distribution of those ranges listed are examples. One of ordinary skill in the art could use a different voltage range, or distribute the ranges differently.

As the reader will appreciate, a set of two 2½ bit cells results in four more combinations of programmed states than are necessary to store each possible data state, with each data state being represented by a different 5 bit combination. These combinations are indicated in table 302 at 362 by "invalid." That is, the combinations of programmed states 362 are invalid combinations because they do not correspond to a data state. As is described below in connection with FIG. 4B, error correction code (ECC) can be used to correct errors associated with sets of cells programmed to invalid combinations 362 of programmed states. As one of ordinary skill in the art will appreciate, a comparable table to table 302 could be created for a set of memory cells with each cell storing a fractional number of bits other than 2½.

Figure 4A:
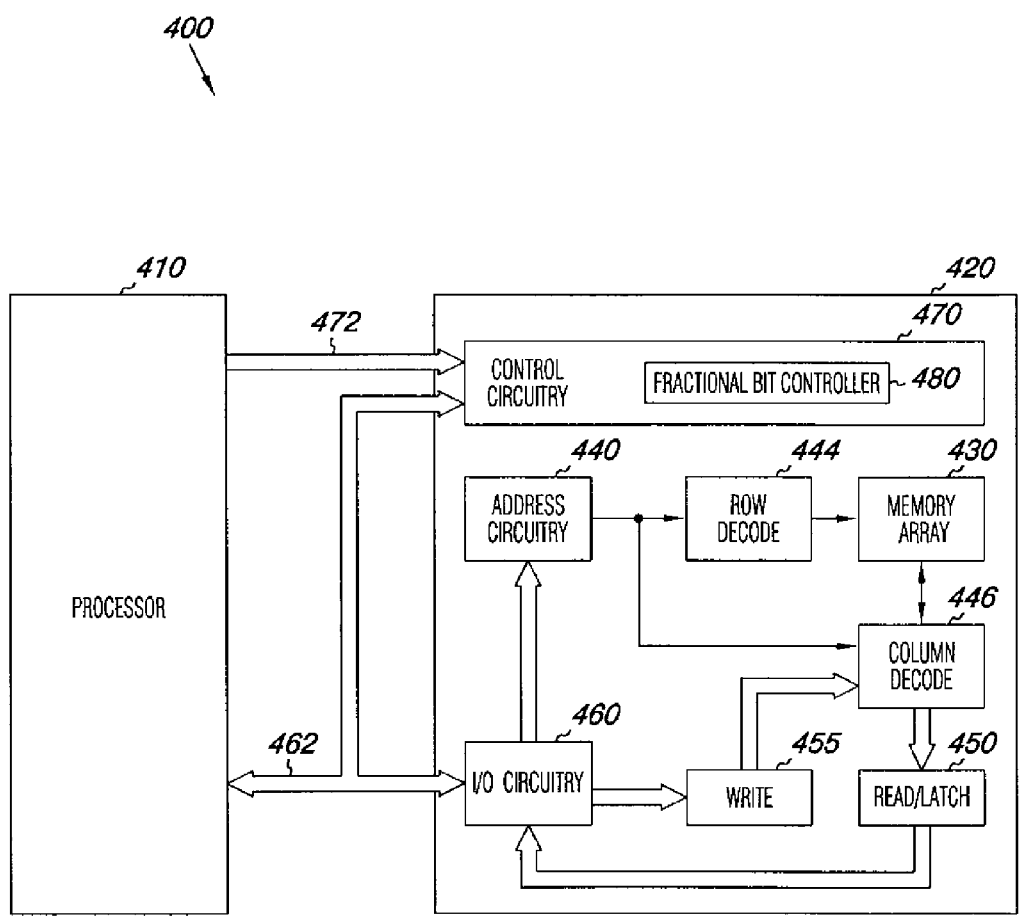
FIG. 4A is a functional block diagram of an electronic memory system having at least one memory device operated in accordance with one or more embodiments of the present disclosure.

FIG. 4A is a functional block diagram of an electronic memory system 400 having at least one memory device 420 operated in accordance with one or more embodiments of the present disclosure. Memory system 400 includes a processor 410 coupled to a non-volatile memory device 420 that includes a memory array 430 of multilevel non-volatile cells. The memory system 400 can include separate integrated circuits or both the processor 410 and the memory device 420 can be on the same integrated circuit. The processor 410 can be a microprocessor or some other type of controlling circuitry such as an application-specific integrated circuit (ASIC).

The memory device 420 includes an array of non-volatile memory cells 430, which can be floating gate flash memory cells, as the same has been illustrated in FIG. 1.

The embodiment of FIG. 4A includes address circuitry 440 to latch address signals provided over I/O connections 462 through I/O circuitry 460. Address signals are received and decoded by a row decoder 444 and a column decoder 646 to access the memory array 430. It will be appreciated by those skilled in the art that the number of address input connections depends on the density and architecture of the memory array 430 and that the number of addresses increases with both increased numbers of memory cells and increased numbers of memory blocks and arrays.

The memory array 430 of non-volatile cells can include non-volatile multilevel memory cells having different numbers of Vt levels, sensing voltages, and numbers of bits according to embodiments described herein. The memory device 420 senses data in the memory array 430 by sensing voltage and/or current changes in the memory array columns using sense/buffer circuitry that in this embodiment can be read/latch circuitry 450. The read/latch circuitry 450 can read and latch a page of data from the memory array 430. I/O circuitry 460 is included for bi-directional data communication over the I/O connections 462 with the processor 410 and with control circuitry 470. Write circuitry 455 is included to write data to the memory array 430.

Control circuitry 470 decodes signals provided by control connections 472 from the processor 410 and is in bidirectional communication with I/O circuitry 460. These signals can include chip signals, write enable signals, and address latch signals that are used to control the operations on the memory array 430, including data sensing, data write, and data erase operations. In one or more embodiments, the control circuitry 470 is responsible for executing instructions from the processor 410 to perform the operations according to embodiments of the present disclosure. The control circuitry 470 can be a state machine, a sequencer, or some other type of controller. It will be appreciated by those skilled in the art that additional circuitry and control signals can be provided, and that the memory device detail of FIG. 4A has been reduced to facilitate ease of illustration. Control circuitry 470 includes a fractional bit controller 480 that can be used to perform one or more embodiments of the present disclosure. Optionally, fractional bit controller 480 can be a component separate from control circuitry 470.

Figure 4B:
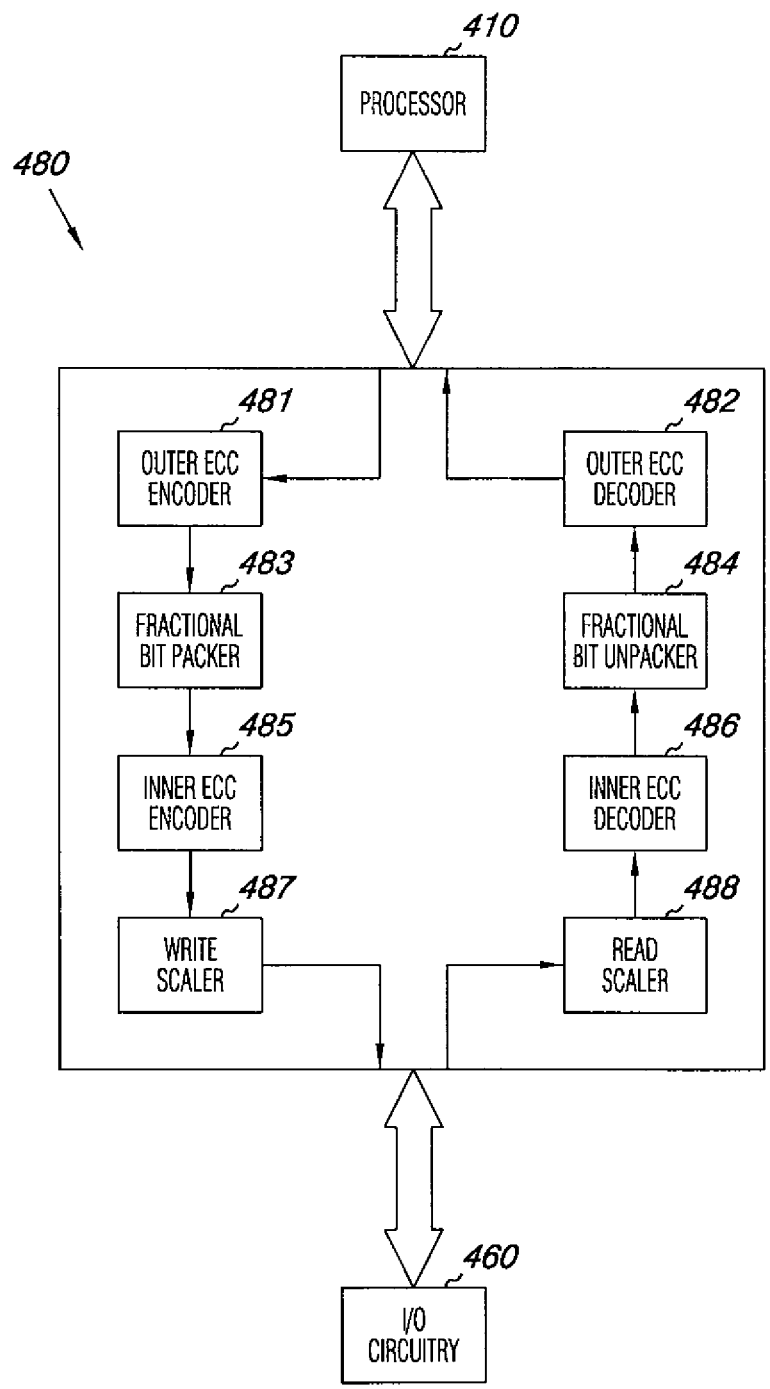
FIG. 4B is a functional block diagram of a fractional bit controller in accordance with one or more embodiments of the present disclosure.

FIG. 4B is a functional block diagram of a fractional bit controller 480 in accordance with one or more embodiments of the present disclosure. Fractional bit controller 480 is shown in bidirectional communication with a processor 410 and I/O circuitry 460 as described above in connection with FIG. 4A. As the reader will appreciate, fractional bit controller 480 could be part of control circuitry, e.g., control circuitry 470 in FIG. 4A, or it could be an independent component of a memory device.

Fractional bit controller 480 can include an outer error correction code (ECC) encoder 481 for adding error correction information to other data being stored in memory cells. Storing a fractional number of bits in memory cells that are read together in a set to output an integer number of bits can result in more bit combinations than are required to output every combination of values within the integer number of bits. An example is described above with respect to FIG. 3B and element 362. Such bit combinations represented at element 362 can be referred to as "invalid combinations." As the reader will appreciate, the specific invalid combinations illustrated in FIG. 3B are examples. In other embodiments, the invalid combinations 362 indicated in FIG. 3B could represent data, while certain of the valid combinations representing data in FIG. 3B could be indicated as invalid combinations.

Outer ECC encoder 481 can send a signal to the fractional bit packer indicating at least one data state that represents error correction information. Outer ECC encoder 481 can also encode error correction information, e.g., according to block code, as will be understood by one of ordinary skill in the art. Outer ECC encoder 481 can include logic indicating which programmed state combinations for a set of memory cells result in invalid combinations. Logic on outer ECC encoder 481 can use such an indication of invalid combinations to better correct errors. Furthermore, the choice of which combinations of programmed states result in invalid combinations can be altered to facilitate error correction. Outer ECC encoder 481 can have an interface with processor 410 for receiving data to be encoded with error correction information. Outer ECC encoder 481 can also have an interface with fractional bit packer 483 to transmit data after it has been encoded with ECC information.

Fractional bit controller 480 can include a fractional bit packer 483 with interfaces from outer ECC encoder 481 and to inner ECC encoder 485. In some embodiments fractional bit packer 483 can receive at least one signal that indicates at least one data state representing an integer number of bits, and send at least one signal that indicates a number of programmed states each representing a fractional number of bits, wherein the number of programmed states denote digits of the data state as expressed by a number in base N, where N is equal to $2^B$, rounded up to an integer, and where B is equal to the fractional number of bits.

Fractional bit packer 483 can parse binary data into data states representing a number of bits stored in a set of cells. A set of memory cells can be selected based on a number of cells required to produce an integer number of bits when the bits stored in each cell of the set are combined. For example, a particular string of binary data, such as, "0010010010000010000100101," could be stored in sets of four 3¼ bit cells (i.e., where each cell in the set can be programmed to one of ten programmed states). Logic on the fractional bit packer 483 could split the data into two data states represented by two groups of 13 bits such as, "0010010010000_0010000100101," where each of the two data states is one of $2^{13}$ (8192) possible data states, and wherein each respective data state could be stored in a set of four 3¼ bit cells (i.e., a data state could be uniquely represented by a respective one of the $10^4$ (10,000) possible combinations of programmed states that can be stored in the set of cells).

Fractional bit packer 483 can also convert each data state from binary to base N, where N is equal to $2^B$, rounded up to an integer, and where B is equal to a number of bits stored in a particular cell. Continuing the example above, the representation of each data state by a group of 13 bits could be converted (from binary notation) to base ($2^{3¼}$=9.51, which rounds up to the integer 10) notation. In this example, data represented by the binary digits (bits) "0010010010000_0010000100101" can be denoted by the digits, "1168_1061" in base 10 notation.

Further, fractional bit packer 483 can divide each digit of the number in base N by N, e.g., 10 in this continuing example. The result of this divide operation in the continuing example is 0.1, 0.1, 0.6, 0.8_0.1, 0, 0.6, 0.1. Dividing the digits by N can prepare the values for programming to a memory cell. This process can be described as packing the data states into programmed states. Accordingly, as each of the two data states can be represented by four digits, i.e. programmed states, in the base notation determined according to the aforementioned algorithm, the fractional bit packer can select a set of four cells, the set to be used to store each data state. As the reader will appreciate, the functionality of fractional bit packer 483 is not limited to this example of numbers of bits. The process of associating each of the programmed states with charges to which a memory cell can be programmed is described below with respect to write scaler 487.

Referring now generally to bit packer 483, outside of the continuing example, bit packer 483 can contain a number of divide-by circuits to perform the packing operation described above. For example, bit packer 483 can include a divide-by-5 circuit, a divide-by-6 circuit, a divide-by-7 circuit, and a subtractor circuit for use with memory cells storing bits with ¼ fractional remainders. A 2¼ bit cell can store one of five programmed states, a 2½ bit cell can store one of six programmed states, and a 2¾ bit cell can store one of seven programmed states. Thus, the above mentioned divide-by circuits can be used by bit packer 483 to pack data states into programmed states for cells storing a ¼ bit fractional remainder. Although 3¼ bit cells can be programmed to one of a larger number of programmed states, the number of programmed states for each is exactly twice that of the 2¼ bit cells. This trend continues for all ¼ bit cells, e.g., 4¼ bits, 5¼ bits, etc. Therefore, the same circuitry can be used for any such device with the appropriate modifications as will be understood by one of ordinary skill in the art.

Similarly, bit packer 483 can include a divide-by-9 circuit, a divide-by-10 circuit, a divide-by-11 circuit, a divide-by-12 circuit, a divide-by-13 circuit, a divide-by-14 circuit, a divide-by-15 circuit, and a subtractor circuit for use with memory cells storing bits with ⅛ fractional remainders. The number of divide-by circuits can be used by the bit packer 483 to pack data states into programmed states for a particular cell.

Fractional bit packer 483 can also operate with data stored in memory cells that store different numbers of bits. For example, a number of cells in a set to be used could also be selected based on the least common denominator for the fractional remainders of bits that could be stored in the cells. For example, a memory device could include cells that store 3 bits, 3¼ bits, 3½ bits, and 3¾ bits. In this example, a set size of four cells could be selected based on a least common denominator of four. Furthermore, a set size could be equal to a denominator of a fractional remainder of the fractional number of bits. A set size of four could be used when storing data in cells containing 3½ bits, although a set size of two cells would otherwise be sufficient to obtain an integer number of bits when combined. As used herein, "fractional remainder" means the fractional value of bits stored in a memory cell, discounting any integer number. For example, a cell storing 3¼ bits has a fractional remainder of ¼. Therefore a set of memory cells can include C cells, where C is equal to an inverse of a fractional remainder of the number of bits stored in the cells.

Fractional bit controller 480 can include an inner ECC encoder 485 with an interface from fractional bit packer 483 and an interface to write scaler 487. Inner ECC encoder can send a signal to the write scaler 487 indicating at least one programmed state that represents error correction information. Storing a fractional number of bits in memory cells that are read together as a set to output an integer number of bits can result in more combinations of packed programmed states, than are required to output every combination of values within the integer number of bits. An example is described above with respect to FIG. 3B and element 362. Inner ECC encoder 485 can encode error correction information, e.g., convolutional code, as will be understood by one of ordinary skill in the art, e.g., in blocks of cells not storing user data. As described above with respect to outer ECC encoder 481, inner ECC encoder 485 can utilize indications of invalid combinations of programmed states to better correct errors. Logic on inner ECC encoder 481 can function to encode information using valid combinations of programmed states and avoid encoding information using invalid combinations of programmed states.

Fractional bit controller 480 can include a write scaler 487 with an interface from inner ECC encoder 485. In some embodiments, write scaler 487 can receive at least one signal that indicates the number of programmed states to which a set of cells are to be programmed, and send at least one signal that indicates a number of charges, normalized by N from a voltage range for the set of cells, which are to be stored in the cells of the set, where N has been defined above.

Write scaler 487 can also have an interface with I/O circuitry 460 for storing, e.g., programming, data in memory cells. Write scaler 487 can distribute the data represented by numbers converted by fractional bit packer 483 as charges normalized by N from a voltage range for a particular cell. Write scaler 487 can be used to store a charge on a cell corresponding to a particular programmed state by scaling the programmed state to a voltage range for the cell. According to one or more embodiments of the present disclosure, a particular memory device can have any voltage range. Some flash memory cells operate at a voltage range of −2V to +3V. For purposes of illustration, a voltage range of 0V to +1V will be used. As defined above, N is a number base equal to $2^B$, rounded up to an integer, where B is equal to a number of bits stored in a particular cell.

Continuing the example started above with respect to fractional bit packer 483, write sealer 487 can distribute the data expressed by numbers, "1168_1061," across an example voltage range of 0V to +1V, normalized by 10. That is, a cell storing 3¼ bits, can have 10 programmed states represented by, e.g., threshold voltage levels. In this example, 1V/10 states=0.1V/state. The voltage levels could then be 0, 0.1, 0.2, 0.3, 0.4, 0.5, 0.6, 0.7, 0.8, and 0.9 volts. In this example, the data string would be distributed as, "0.1, 0.1, 0.6, 0.8_0.1, 0, 0.6, 0.1," in sets of four cells as indicated by the underscore. That is, each digit in a group can be represented by one of ten threshold voltage levels in each cell. Accordingly, the group of data represented by "1168" can be represented by four cells, each capable of storing a number of programmed states corresponding to 3¼ bits, such as by programming one of the cells to a threshold voltage level of 0.1V, the second of the four cells to a threshold voltage level of 0.1V, the third of the four cells to a threshold voltage level of 0.6V, and the fourth of the four cells to a threshold voltage level of 0.8V.

Fractional bit controller 480 can include a read scaler 488. Read scaler 488 can receive at least one signal that indicates a number of charges stored in a number of cells of a set of memory cells, and send at least one signal that indicates a number of programmed states that correspond to the number of charges.

Read scaler 488 can be used for converting signals, sensed by sensing circuitry, as controlled by control circuitry, to normalized values according to a number of states that the particular cells can store. Consider, as a new example, two sets of two cells, each storing 3½ bits, for a combined 7 bits for each set with a voltage range of 0V to 1V. Each cell is capable of storing 12 programmed states, represented by 12 threshold voltage levels. Sensing circuitry could sense, for example, voltages of 0.16V, 0.08V__0.32V, 0.40V. Logic on read scaler 488 could convert the charges to normalized values. As describe above, a value can be normalized by N, in this case 2^(3½), rounded up to an integer, 12, e.g., the number of programmed states. Therefore, the voltages of 0.16V, 0.08V, 0.32V, 0.40V would be converted to program states as represented by the decimal numbers 2, 1, 4, 5. Read scaler 488 can have an interface with I/O circuitry for sensing, e.g., reading data from memory cells. Read scaler 488 can also have an interface to inner ECC decoder 486.

Fractional bit controller 480 can include an inner ECC decoder 486 for decoding error correction information stored as programmed states not used to represent one of the data states, as described above in connection with this Figure, and FIG. 3B. Inner ECC decoder 486 can decode error correction information for use as, for example, convolutional code, as will be understood by one of ordinary skill in the art. Inner ECC decoder 486 can have an interface from read scaler 488 and an interface to fractional bit unpacker 484.

Fractional bit controller 480 can include a fractional bit unpacker 484. Fractional bit unpacker 484 can receive at least one signal that indicates the number of programmed states, where each programmed state represents a fractional number of bits, and where each programmed state denotes a digit of a data state as expressed by a number in base N, where N is equal to $2^B$, rounded up to an integer, and where B is equal to the fractional number of bits. Fractional bit unpacker 484 can also send a signal that indicates the data state representing an integer number of bits.

Fractional bit unpacker 484 can be used for multiplexing the programmed states of the set of cells according to an algorithm where programmed states denote digits of a data state as represented by a number in base N, where N is equal to $2^B$ rounded up to an integer, and where B is equal to the fractional number of bits. Fractional bit unpacker 484 can combine the normalized values from each cell in the set and convert the combined normalized values to a binary value. Continuing the example started in connection with read scaler 488, the values 2, 1, 4, 5, would be combined into groups of two, in this example, yielding, "21__45." This combined normalized value would then be converted to a binary value. As described above, a normalized value for a 3½ bit cell is in base 12, and would be converted to binary by fractional bit unpacker 484. In this example, the result of that conversion is 0011001 as 7 binary bits of data. Fractional bit unpacker 484 can have an interface from inner ECC decoder 486 and to outer ECC decoder 482.

Fractional bit controller 480 can include an outer ECC decoder 482 for decoding error correction information stored as bit combinations not used to represent a data state, as described above in connection with this Figure, and FIG. 3B. Outer ECC decoder 482 can decode error correction information for use as block code, as will be understood by one of ordinary skill in the art. Outer ECC decoder 482 can have an interface from fractional bit unpacker 484, and an interface with processor 410 for processing error correction information and data, among other operations.

As one of ordinary skill in the art will appreciate, fractional bit controller 480 can operate according to various embodiments without the inclusion of every element of error correction processing described in the example embodiment illustrated in FIG. 4B. The description provided herein with respect to FIG. 4B illustrates one example embodiment, and is not a limitation of other embodiments that could be practiced by one of ordinary skill in the art according to the present disclosure. For example, different combinations and/or arrangements of interfaces between components can be practiced.

Figure 5:
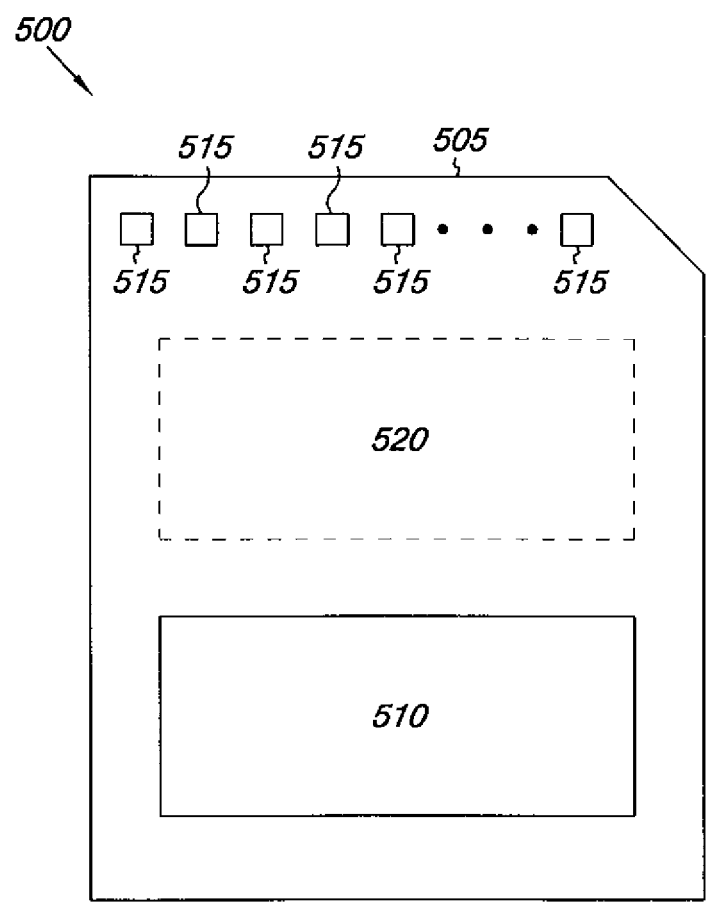
FIG. 5 is a functional block diagram of a memory module having at least one memory device in accordance with one or more embodiments of the present disclosure.

FIG. 5 is a functional block diagram of a memory module 500 having at least one memory device in accordance with one or more embodiments of the present disclosure. Memory module 500 is illustrated as a memory card, although the concepts discussed with reference to memory module 500 are applicable to other types of removable or portable memory (e.g., USB flash drives) and are intended to be within the scope of "memory module" as used herein. In addition, although one example form factor is depicted in FIG. 5, these concepts are applicable to other form factors as well.

In one or more embodiments, memory module 500 will include a housing 505 (as depicted) to enclose one or more memory devices 510, though such a housing is not essential to all devices or device applications. At least one memory device 510 includes an array of non-volatile multilevel memory cells that can be sensed according to embodiments described herein. Where present, the housing 505 includes one or more contacts 515 for communication with a host device. Examples of host devices include digital cameras, digital recording and playback devices, PDAs, personal computers, memory card readers, interface hubs and the like. For one or more embodiments, the contacts 515 are in the form of a standardized interface. For example, with a USB flash drive, the contacts 515 might be in the form of a USB Type-A male connector. For one or more embodiments, the contacts 515 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 515 provide an interface for passing control, address and/or data signals between the memory module 500 and a host having compatible receptors for the contacts 515.

The memory module 500 may optionally include additional circuitry 520, which may be one or more integrated circuits and/or discrete components. For one or more embodiments, the additional circuitry 520 may include control circuitry, such as a memory controller, for controlling access across multiple memory devices 510 and/or for providing a translation layer between an external host and a memory device 510. For example, there may not be a one-to-one correspondence between the number of contacts 515 and a number of 510 connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510 such as logic functions as might be performed by an ASIC. Also, the additional circuitry 520 may include circuitry to restrict read or write access to the memory module 500, such as password protection, biometrics or the like. Additional circuitry 520 may include a means for wireless communication with a host device to be used in lieu of contacts 515. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

CONCLUSION

The present disclosure includes methods, devices, modules, and systems for programming memory cells. One method embodiment includes storing charges corresponding to a data state that represents an integer number of bits in a set of memory cells. The method also includes storing a charge in a cell of the set, where the charge corresponds to a programmed state, where the programmed state represents a fractional number of bits, and where the programmed state denotes a digit of the data state as expressed by a number in base N, where N is equal to $2^B$, rounded up to an integer, and where B is equal to the fractional number of bits represented by the programmed state.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
a set of memory cells;
sense circuitry to sense each memory cell of the set of memory cells to determine a respective threshold voltage level for each memory cell of the set, wherein the threshold voltage level for a respective memory cell of the set corresponds to a non-integer number of bits of data stored in the respective memory cell and denotes a respective digit of a data state as expressed by a number in base N, where N is equal to $2^B$, rounded up to an integer, and where B is equal to the non-integer number of bits represented by the threshold voltage level; and
a fractional bit controller to output an integer number of bits of data representing a combination of the threshold voltage levels for the set and comprising the data state.

2. The memory device of claim 1, wherein the fractional bit controller comprises a read scaler to receive a signal that indicates the threshold voltages levels for the set and send a signal that indicates a number of programmed states that correspond to the threshold voltage levels for the set.

3. The memory device of claim 1, wherein the fractional bit controller comprises an inner ECC decoder to decode error correction information stored as programmed states not used to represent the data state.

4. The memory device of claim 1, wherein the fractional bit controller comprises a fractional bit unpacker to receive a signal indicating the number of programmed states, where each of the programmed states represents a fractional number of bits, where each programmed state denotes a respective digit of the data state as expressed by the number in base N, and wherein the fractional bit unpacker is further configured to send a signal that indicates the data state.

5. The memory device of claim 1, wherein the fractional bit controller comprises an outer ECC decoder to decode error correction information stored as bit combinations not used to represent a data state.

6. The memory device of claim 5, wherein the decoded error correction information is used as block code.

7. A memory device, comprising:
a set of memory cells;
a fractional bit controller to receive an integer number of bits of data comprising a data state; and
write circuitry to program each memory cell of the set of memory cells to a respective threshold voltage level corresponding to a non-integer number of bits of data stored in the respective cell, wherein a sum of the non-integer number of bits of data stored in each cell of the set is equal to the received integer number of bits of data, and wherein each threshold voltage level denotes a respective digit of the data state as expressed by a number in base N, where N is equal to $2^B$, rounded up to an integer, and where B is equal to the non-integer number of bits stored in each cell.

8. The memory device of claim 7, wherein the fractional bit controller comprises a fractional bit packer to receive a signal that indicates the data state and to send a signal that indicates a number of programmed states, each of the number of programmed states representing a fractional number of bits, wherein the number of programmed states denote the digits of the data state as expressed by the number in base N.

9. The memory device of claim 8, wherein the fractional bit controller further comprises an outer ECC encoder with an interface to the fractional bit packer to send a signal to the fractional bit packer indicating at least one data state that represents error correction information.

10. The memory device of claim 7, wherein the fractional bit controller comprises a write scaler to receive a signal that indicates a number of programmed states to which the set of cells are to be programmed and to send a signal that indicates a number of charges, normalized by N from a voltage range for the set of cells, which are to be stored in the cells of the set.

11. The memory device of claim 10, wherein the fractional bit controller further comprises an inner ECC encoder with an interface to the write scaler to send a signal to the write scaler indicating at least one programmed state that represents error correction information.

12. The memory device of claim 7, wherein the fractional bit controller further comprises an outer ECC encoder to receive the integer number of bits of data and encode the data with error correction information.

13. The memory device of claim 12, wherein the outer ECC encoder includes logic indicating which programmed state combinations for the set of memory cells result in invalid combinations.

14. The memory device of claim 7, wherein the fractional bit controller comprises an inner ECC encoder to encode error correction information in blocks of cells not storing user data.

15. A system, comprising:
a processor; and
a memory device coupled to the processor, the memory device comprising:
a set of memory cells;
sense circuitry to sense each memory cell of the set of memory cells to determine a respective threshold voltage level for each memory cell of the set, wherein the threshold voltage level for a respective memory cell of the set corresponds to a non-integer number of bits of data stored in the respective memory cell and denotes a respective digit of a data state as expressed by a number in base N, where N is equal to $2^B$, rounded up to an integer, and where B is equal to the non-integer number of bits represented by the threshold voltage level; and
a fractional bit controller to output an integer number of bits of data representing a combination of the threshold voltage levels for the set and comprising the data state.

16. The system of claim 15, wherein the processor and the memory device are on a same integrated circuit.

17. The system of claim 15, wherein the processor and the memory device comprise separate integrated circuits.

18. A system, comprising:
a processor; and
a memory device coupled to the processor, the memory device comprising:
a set of memory cells;
a fractional bit controller to receive an integer number of bits of data comprising a data state; and
write circuitry to program each memory cell of the set of memory cells to a respective threshold voltage level corresponding to a non-integer number of bits of data stored in the respective cell, wherein a sum of the non-integer number of bits of data stored in each cell of the set is equal to the received integer number of bits of data, and wherein each threshold voltage level denotes a respective digit of the data state as expressed by a number in base N, where N is equal to $2^B$, rounded up to an integer, and where B is equal to the non-integer number of bits stored in each cell.

19. The system of claim 18, wherein the fractional bit controller includes a number of divide-by circuits to pack data states into programmed states for a particular one of the set of memory cells.

20. The system of claim 18, wherein the fractional bit controller comprises a fractional bit packer to receive at least one signal that indicates at least one data state representing an integer number of bits, and send at least one signal that indicates a number of programmed states each representing a fractional number of bits.

* * * * *